US012701660B2

(12) United States Patent
Huang et al.

(10) Patent No.: US 12,701,660 B2
(45) Date of Patent: Aug. 4, 2026

(54) SANDWICH STRUCTURE POWER SUPPLY MODULE

(71) Applicant: Monolithic Power Systems, Inc., San Jose, CA (US)

(72) Inventors: Daocheng Huang, Santa Clara, CA (US); Zhao Yuan, San Jose, CA (US); Yishi Su, Hangzhou (CN); Wenyang Huang, Hangzhou (CN); Xintong Lyu, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 945 days.

(21) Appl. No.: 17/588,630

(22) Filed: Jan. 31, 2022

(65) Prior Publication Data

US 2022/0295638 A1 Sep. 15, 2022

Related U.S. Application Data

(63) Continuation-in-part of application No. 17/197,394, filed on Mar. 10, 2021, now Pat. No. 12,309,929.

(51) Int. Cl.
*H01F 27/28* (2006.01)
*H01F 27/24* (2006.01)
(Continued)

(52) U.S. Cl.
CPC .............. *H05K 1/181* (2013.01); *H01F 27/24* (2013.01); *H01F 27/28* (2013.01); *H05K 1/111* (2013.01);
(Continued)

(58) Field of Classification Search
CPC .......... H05K 1/181; H05K 1/111; H05K 1/14; H05K 2201/1003; H05K 2201/042;
(Continued)

(56) References Cited

U.S. PATENT DOCUMENTS 8,064,202 B2 11/2011 Yin et al.
8,498,124 B1 * 7/2013 Folker ..................... H01F 27/06
361/740

(Continued)

FOREIGN PATENT DOCUMENTS

CN 203289736 U 11/2013
CN 207074591 U 3/2018
(Continued)

OTHER PUBLICATIONS

U.S. Appl. No. 17/197,394, filed Mar. 10, 2021, Monolithic Power Systems Inc.

*Primary Examiner* — Mang Tin Bik Lian
(74) *Attorney, Agent, or Firm* — Perkins Coie LLP

(57) ABSTRACT

A sandwich structure power supply module, having: an inductor pack having a first inductor and a second inductor; a top PCB (Printed Circuit Board) on top of the inductor pack; and a first power device chip and a second power device chip on top of the top PCB, wherein the first power device chip has at least one pin electrically connected to the first inductor via the top PCB, and the second power device chip has at least one pin electrically connected to the second inductor via the top PCB; wherein each inductor comprises one winding having a first end and a second end, and wherein at least one of the first end and the second end of each winding is bent to and extended at a plane perpendicular to an axis along a length of the winding.

15 Claims, 9 Drawing Sheets

(51) Int. Cl.
  _H05K 1/11_      (2006.01)
  _H05K 1/14_      (2006.01)
  _H05K 1/181_     (2026.01)

(52) U.S. Cl.
  CPC ....... _H05K 1/14_ (2013.01); _H05K 2201/1003_ (2013.01)

(58) Field of Classification Search
  CPC ......... H05K 1/144; H01F 27/24; H01F 27/28; H01F 3/14; H01F 2003/106; H01F 3/10; H01F 27/2852; H01F 27/306; H01F 27/34; H01F 2027/065; H01F 27/06; H01F 27/29
  See application file for complete search history.

(56)            References Cited

U.S. PATENT DOCUMENTS

| | | | |
|---|---|---|---|
| 8,604,597 | B2 | 12/2013 | Jiang |
| 8,742,490 | B2 | 6/2014 | Disney |
| 9,263,177 | B1 * | 2/2016 | Ikriannikov ........ H01F 17/0013 |
| 9,788,430 | B1 * | 10/2017 | Folker ..................... H01F 27/06 |
| 11,398,333 | B2 | 7/2022 | Huang et al. |
| 11,682,515 | B2 | 6/2023 | Huang et al. |
| 2005/0184372 | A1 | 8/2005 | Asahi et al. |
| 2008/0309442 | A1 * | 12/2008 | Hebert ................. H01F 27/292 257/738 |
| 2010/0176909 | A1 | 7/2010 | Yasuda et al. |
| 2012/0056703 | A1 * | 3/2012 | Ikriannikov .......... H01F 27/292 336/188 |
| 2012/0193772 | A1 | 8/2012 | Jiang |
| 2017/0287615 | A1 * | 10/2017 | Lu .............................. H01F 3/10 |
| 2018/0122562 | A1 * | 5/2018 | Ji ........................... H05K 1/181 |
| 2018/0330870 | A1 | 11/2018 | Sakai et al. |
| 2018/0366256 | A1 * | 12/2018 | Kuo .................... H01F 27/2847 |
| 2019/0295765 | A1 * | 9/2019 | Yan ........................ H01F 27/306 |
| 2020/0113058 | A1 * | 4/2020 | Xiong .................... H01R 12/52 |
| 2020/0113059 | A1 | 4/2020 | Xiong et al. |
| 2020/0312766 | A1 | 10/2020 | Bhagavat et al. |
| 2021/0272737 | A1 * | 9/2021 | Jin ...................... H01F 27/2804 |
| 2022/0254563 | A1 * | 8/2022 | Yan ........................ H01F 27/292 |
| 2022/0285075 | A1 * | 9/2022 | Zhang ................. H01F 27/2823 |
| 2022/0295635 | A1 | 9/2022 | Huang et al. |
| 2022/0295639 | A1 | 9/2022 | Huang et al. |
| 2022/0369464 | A1 | 11/2022 | Huang et al. |
| 2023/0137975 | A1 | 5/2023 | Chen et al. |
| 2023/0269877 | A1 | 8/2023 | Huang et al. |
| 2023/0282569 | A1 | 9/2023 | Muto et al. |
| 2023/0396158 | A1 | 12/2023 | Huang et al. |

FOREIGN PATENT DOCUMENTS

| | | |
|---|---|---|
| CN | 207074596 U | 3/2018 |
| CN | 207149384 U | 3/2018 |
| CN | 108022917 A | 5/2018 |
| CN | 111313655 A | 6/2020 |

* cited by examiner

10

60

601

602

SANDWICH STRUCTURE POWER SUPPLY MODULE

CROSS-REFERENCE TO RELATED APPLICATIONS

The present invention is a continuation-in-part of U.S. application Ser. No. 17/197,394 filed on Mar. 10, 2021, which is incorporated herein by reference.

TECHNICAL FIELD

The present invention generally relates to electrical components, and more particularly but not exclusively relates to power supply modules.

BACKGROUND

Power converter, as known in the art, converts an input power to an output power for providing a load with required voltage and current. Multi-phase power converter comprising a plurality of paralleled power stages operating out of phase has lower output ripple voltage, better transient performance and lower ripple-current-rating requirements for input capacitors. They are widely used in high current and low voltage applications, such as server, microprocessor.

With the development of modern GPUs (Graphics Processing Units), and CPUs (Central Processing Units), increasingly high load current is required to achieve better processor performance. However, the size of microprocessor needs to become smaller. Higher current and smaller size put more challenges to the heat conduction. Therefore, high-power density and high-efficiency power converters with excellent heat dissipation path are necessary.

SUMMARY

It is an object of the present invention to provide a sandwich structure power supply module with inductors, power switches and drivers mounted and integrated in a small size power supply module.

FIG. 2 shows a sandwich structure power supply module 20 for a dual-phase power converter in accordance with an embodiment of the present invention. The power supply module 20 may serve as the power stage 102 of FIG. 1, with N=2. The sandwich structure power supply module 20 comprises: a bottom PCB 201 at the bottom of the sandwich structure power supply module 20; an inductor pack 206 having two inductors located on the bottom PCB 201, wherein each inductor has a first end and a second end; a top PCB 202 on the top of the inductor pack 206; a connector 204 placed between the bottom PCB 201 and the top PCB 202, wherein the connector 204 has a plurality of metal pillars 205 respectively connecting solder pads on the bottom PCB to solder pads on the top PCB; and two power device chips 203 on the top of the top PCB 202, wherein each one of the power device chips 203 has one or more than one pins (e.g., SW pin connected to the inductor L1 as shown in FIG. 1) electrically connected to the second end of one inductor of the inductor pack 206 via the top PCB 202; wherein each inductor comprises a winding 207 having ends folded to a plane perpendicular to an axis along a length of the winding 207.

The embodiments of the present invention are directed to an inductor pack used with a sandwich structure power supply module, comprising: a magnetic core, having a symmetrical shape from top view, and having two passageways passing through the magnetic core from top to bottom, and symmetrically located on two sides of a central axis of a top surface of the symmetrical magnetic core; and two windings respectively passing through the two passageways, wherein each winding has a first end and a second end, and wherein at least one of the first end and the second end of each winding is bent to and extended at a plane perpendicular to an axis along a length of the winding.

The sandwich structure power supply module in the present invention: (1) could save PCB (Printed Circuit Board) footprint compared to the prior art tiled module structure, which improves load current/power density; (2) could minimize the output current trace impedance on PCB and mainly deliver output current through inductor legs to achieve high-efficiency; and (3) with the power device chips on top and inductor pack on bottom structure could largely benefit from the top-side cooling system which is normally adopted by GPU, CPU, ASIC (Application Specific Integrated Circuit) systems.

The inductor pack in the present invention: 1) takes the most advantage of inductor area and thus maximize the inductance value/saturation current; 2) adopts hybrid magnetic core materials to avoid the sharp drop of inductance value at high saturation current. Overall, the inductor pack in the present invention is designed to have low DCR, high inductance at low current for high efficiency, low inductance at high current for good transient performance, and external ground and power legs for high current return path.

BRIEF DESCRIPTION OF THE DRAWINGS

The present invention can be further understood with reference to the following detailed description and the appended drawings, wherein like elements are provided with like reference numerals. The drawings are only for illustration purpose. They may only show part of the devices and are not necessarily drawn to scale.

DETAILED DESCRIPTION

Figure 1:
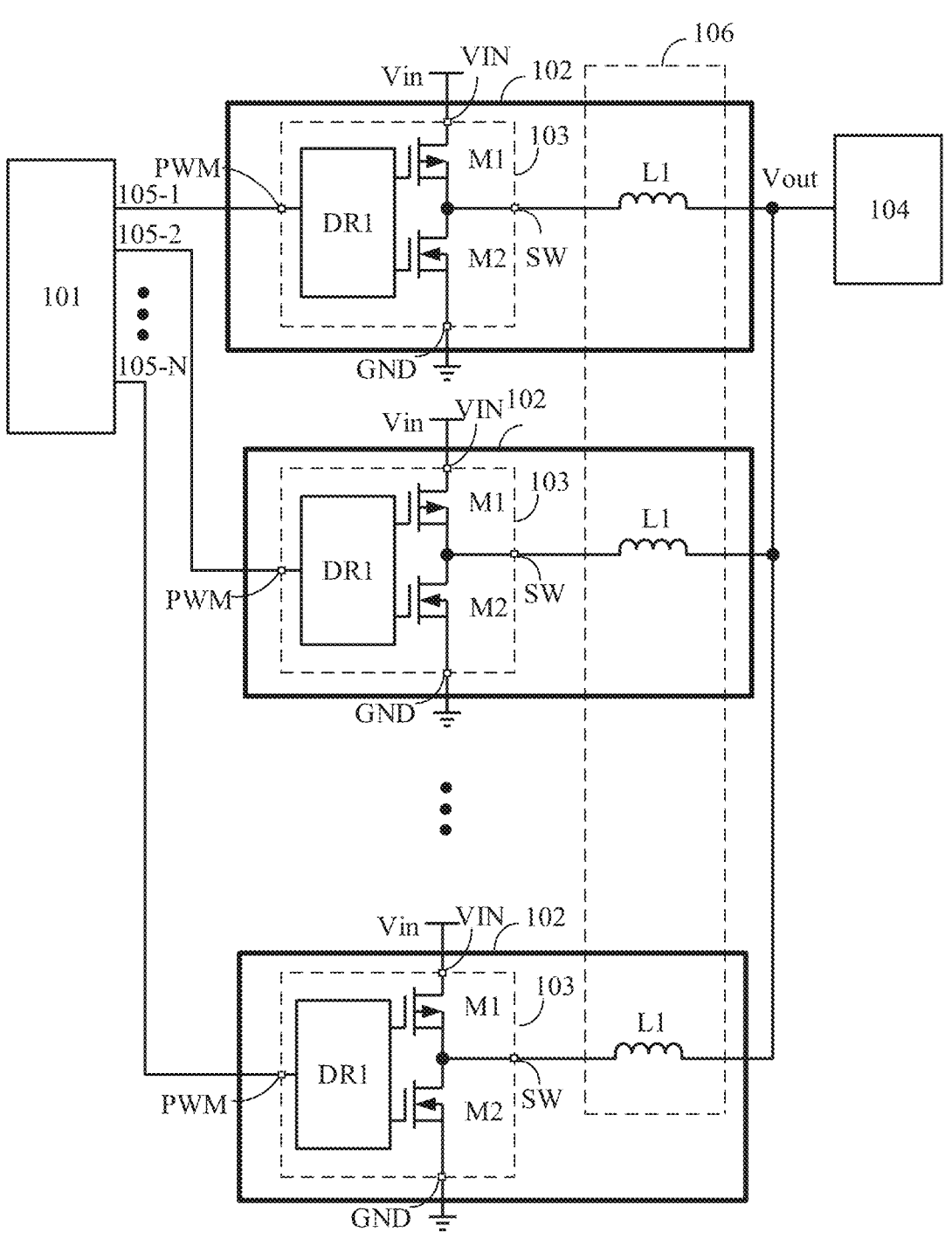
FIG. 1 schematically shows a prior art multi-phase power converter 10 which comprises a controller 101, N power devices 103 and N inductors L1 for supplying power to a load 104.

In the present disclosure, numerous specific details are provided, such as examples of electrical circuits and components, to provide a thorough understanding of embodiments of the invention. Persons of ordinary skill in the art will recognize, however, that the invention can be practiced without one or more of the specific details. It is noted that, for purposes of illustrative clarity, certain elements in the drawings may not be drawn to scale. In other instances, well-known details are not shown or described to avoid obscuring aspects of the invention.

FIG. 1 schematically shows a multi-phase power converter 10 which comprises a controller 101, N power devices 103 and N inductors L1 for supplying power to a load 104, wherein N is an integer, and N>1. Each power device 103 and one inductor L1 represent one power stage, i.e., one phase 102 of the power converter 10, as shown in FIG. 1. Each power device 103 comprises power switches M1, M2 and a driver DR1 for driving the power switches M1 and M2. The controller 101 provides N phase control signals 105-1~105-N respectively to N power devices 103 to control the N phases 102 working out of phase, i.e., the inductors L1 sequentially absorb power from the input source and sequentially deliver power to the load 104. It should be noticed that the outputs of all phases as shown in FIG. 1 are connected to work as a multi-phase converter. However, each phase output may be separated to work as multiple independent converters which could have different output voltage levels for different load demands.

The power stage 102 with Buck topology is shown in FIG. 1 for example. Persons of ordinary skill in the art should appreciate that power stages with other topologies, like Boost topology, Buck-Boost topology could also be adopted in a multi-phase power converter.

The inductors L1 could be implemented by one or a few coupled inductors or could be implemented by N single inductors.

When N=2, the multi-phase power converter 10 is used as a dual-phase power converter or two separate single-phase converters.

Figure 2:
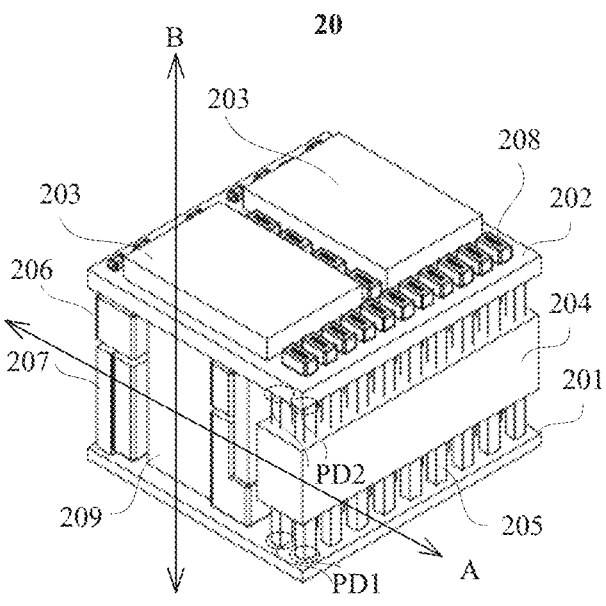
FIG. 2 shows a sandwich structure power supply module 20 for a dual-phase power converter in accordance with an embodiment of the present invention.

FIG. 2 shows a sandwich structure power supply module 20 for a dual-phase power converter in accordance with an embodiment of the present invention. The power supply module 20 may serve as the power stage 102 of FIG. 1, with N=2. The sandwich structure power supply module 20 comprises: a bottom PCB 201 at the bottom of the sandwich structure power supply module 20; an inductor pack 206 having two inductors located on the bottom PCB 201, wherein each inductor has a first end and a second end; a top PCB 202 on the top of the inductor pack 206; a connector 204 placed between the bottom PCB 201 and the top PCB 202, wherein the connector 204 has a plurality of metal pillars 205 respectively connecting solder pads PD1 on the bottom PCB 201 to solder pads PD2 on the top PCB 202; and two power device chips 203 on the top of the top PCB 202, wherein each one of the power device chips 203 has one or more than one pins (e.g., SW pin connected to the inductor L1 as shown in FIG. 1) electrically connected to the second end of one inductor of the inductor pack 206 via the top PCB 202; wherein each inductor comprises a winding 207 having ends folded to a plane perpendicular to an axis along a length of the winding 207.

In FIG. 2, the power supply module 20 further comprises the discrete components 208 located on the top PCB 202. The discrete components 208 comprise resistors and capacitors of the power converter 10, like the input capacitors at the input terminal to provide pulse current, the filter capacitors and resistors for driver and internal logic circuits power supplies, etc.

In one embodiment, the metal pillars 205 comprises copper pillars for soldering the bottom PCB 201 to the top PCB 202. Persons of ordinary skill in the art should appreciate that the metal pillars 205 could be made of any known material for soldering one PCB to another PCB.

The power supply module 20 is utilized to a mainboard to supply power to the devices on the mainboard. The bottom PCB 201 is soldered to the mainboard to electrically connect the necessary pins of the power supply module 20 to the mainboard. In some embodiments, the bottom PCB 201 could be saved. The connector 204 and the inductor pack 206 are soldered to the mainboard directly.

In the present invention, the inductors and the power device chips are mounted to save the footprint on a PCB integrating the power converter 10 and the devices powered by the power converter 10. Each power device chip 203 integrates the power device 103 in FIG. 1, which comprises the power switches M1, M2, the driver DR1, and further integrates some auxiliary circuits not shown in FIG. 1. In one embodiment, each of the power device 103 includes a power pin VIN configured to receive the input voltage Vin, a pin SW configured to deliver power to the load 104 via the inductor L1, a pin PWM configured to receive the control signals (e.g., 105-1~105-N) from the controller 101, and a ground reference pin GND. The pins of the power device chips 203 are electrically connected to the solder pads on the bottom PCB 201 via the top PCB 202, the inductor pack 206 and the connector 204, to make sure that all the necessary signals could be obtained from the bottom PCB 201. Furthermore, for the signals with large current, like ground reference, the power supply module 20 provides metal layers 209. The metal layers 209 solders the top PCB 202 to the bottom PCB 201. The metal layer 209 coats part of a magnetic core of the inductor pack 206. The location of the metal layer 209 is determined by the location of ground reference pins of the power device chips 203. In the example of FIG. 2, since the metal layers 209 are placed at the side of the inductor pack 206, the ends of the metal layers 209 are bent to produce tabs close to the ground reference pins of the power device chips 203, so that to carry high current in the horizontal direction through metal tabs instead of PCB traces which lowers conduction loss and improve efficiency.

Figure 3:
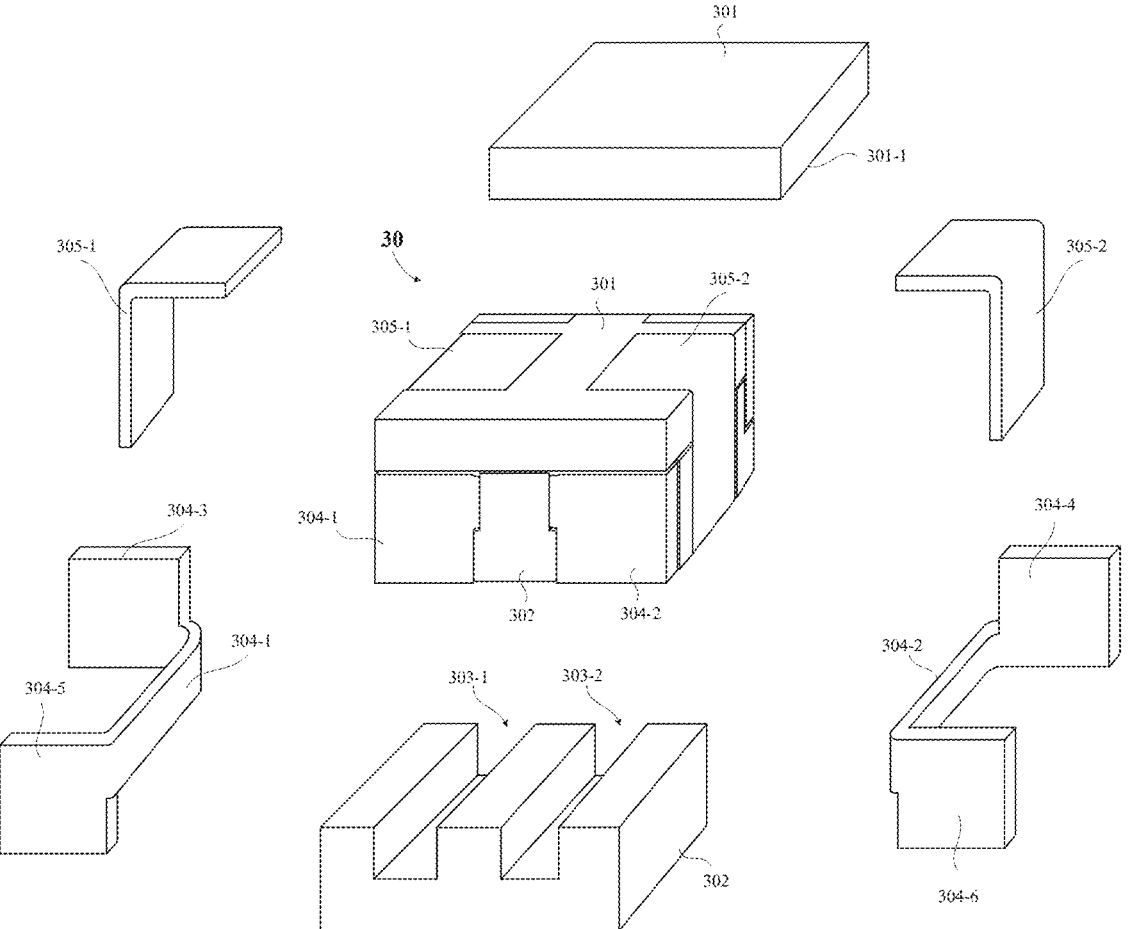
FIG. 3 shows the disassemble view of an inductor pack 30 in accordance with an embodiment of the present invention.

FIG. 3 shows the disassembled view of an inductor pack 30 in accordance with an embodiment of the present invention. The inductor pack 30 may be adopted as the inductor pack 206 in FIG. 2. As shown in FIG. 3, the inductor pack 30 comprises: a magnetic core having a first magnetic core part 301 and a second magnetic core part 302, wherein the first magnetic core part 301 and the second magnetic core part 302 are assembled to have two passageways 303-1 and 303-2 at a planer where the first magnetic core part 301 and the second magnetic core part 302 are aligned; and two windings 304-1 and 304-2 respectively passing through two passageways 303-1 and 303-2 between the first magnetic core part 301 and the second magnetic core part 302.

In the embodiment of FIG. 3, the passageways 303-1 and 303-2 have a depth along an axis A parallel to the bottom PCB 201 and the top PCB 202 shown in FIG. 2.

In the embodiment of FIG. 3, the winding 304-1 has a first end 304-3 bent 90 degrees to cover a surface of the magnetic core and extended to the top PCB 202 to be soldered to the top PCB 202, and a second end 304-5 bent 90 degrees to cover a surface of the magnetic core and extended to the bottom PCB 201 to be soldered to the bottom PCB 201, and wherein the first end 304-3 and the second end 304-5 of the winding 304-1 are extended at a plane perpendicular to an axis along the depth of the passageways 303-1 and 303-2 of the magnetic core. Similarly, the winding 304-2 has a first end 304-4 bent 90 degrees to cover a surface of the magnetic core and extended to the top PCB 202 to be soldered to the top PCB 202, and a second end 304-6 bent 90 degrees to cover a surface of the magnetic core and extended to the bottom PCB 201 to be soldered to the bottom PCB 201, and wherein the first end 304-4 and the second end 304-6 of the winding 304-2 are extended at a plane perpendicular to an axis along the depth of the passageways 303-1 and 303-2 of the magnetic core.

In the embodiment of FIG. 3, the magnetic core has a first magnetic core part 301 and a second magnetic core part 302 which are asymmetrical, wherein the first magnetic core part 301 is in a planar shape and the second magnetic core part 302 has two trenches, and wherein the passageways 303-1, 303-2 is respectively formed by a trench of the second magnetic core 302 and a surface 301-1 of the first magnetic core 301.

In the embodiment of FIG. 3, the metal layers 305-1 and 305-2 have a L-shape. The metal layers 305-1 and 305-2 are configured to solder the top PCB 202 to the bottom PCB 201. The ends of the metal layers 305-1 and 305-2 for soldering the top PCB 202 are bent 90 degrees and extended to produce tabs to be soldered to the ground reference pins of the power device chips 203 via the top PCB 202 with minimized PCB trace impedance inside the top PCB.

Figure 4:
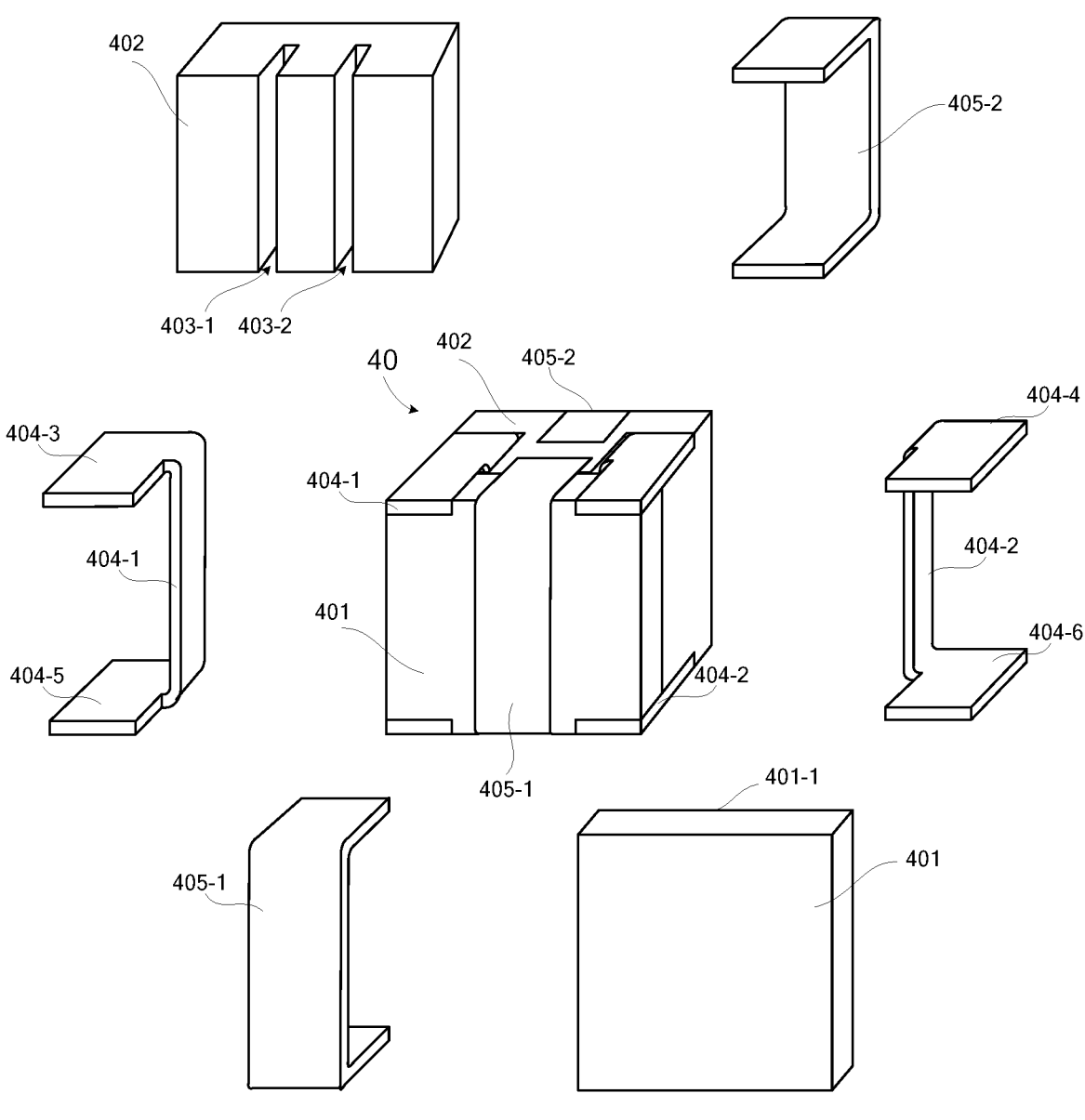
FIG. 4 shows the disassemble view of an inductor pack 40 in accordance with an embodiment of the present invention.

FIG. 4 shows the disassembled view of an inductor pack 40 in accordance with an embodiment of the present invention. The inductor pack 40 may be adopted as the inductor pack 206 in FIG. 2. As shown in FIG. 4, the inductor pack 40 comprises: a magnetic core having a first magnetic core part 401 and a second magnetic core part 402, wherein the first magnetic core part 401 and the second magnetic core part 402 are assembled to have two passageways 403-1 and 403-2 at a planer where the first magnetic core part 401 and the second magnetic core part 402 are aligned; and two windings 404-1 and 404-2 respectively passing through two passageways 403-1 and 403-2 between the first magnetic core part 401 and the second magnetic core part 402.

In the embodiment of FIG. 4, the passageways 403-1 and 403-2 have a depth along an axis B perpendicular to the bottom PCB 201 and the top PCB 202 if adopted by the power supply module 20 in FIG. 2.

In the embodiment of FIG. 4, the winding 404-1 has a first end 404-3 bent 90 degrees to cover a surface of the magnetic core and extended along a surface of the top PCB 202 to be soldered to the top PCB 202, and a second end 404-5 bent 90 degrees to cover a surface of the magnetic core and extended along a surface of the bottom PCB 201 to be soldered to the bottom PCB 201, and wherein the first end 404-3 and the second end 404-5 of the winding 404-1 are extended at a plane perpendicular to an axis along the depth of the passageways 403-1 and 403-2 of the magnetic core. Similarly, the winding 404-2 has a first end 404-4 bent 90 degrees to cover a surface of the magnetic core and extended along a surface of the top PCB 202 to be soldered to the top PCB 202, and a second end 404-6 bent 90 degrees to cover a surface of the magnetic core and extended along a surface of the bottom PCB 201 to be soldered to the bottom PCB 201, and wherein the first end 404-4 and the second end 404-6 of the winding 404-2 are extended at a plane perpendicular to an axis along the depth of the passageways 403-1 and 403-2 of the magnetic core.

In some embodiments, the second end 404-5 of the windings 404-1, and the second end 404-6 of the windings 404-2 are not bent. Whether the second ends of the winding are bent or not, and the locations, shapes of the second ends of the windings, are determined by the locations of the associated solder pads on the bottom PCB of the power supply module, or the associated solder pads on the mainboard if the bottom PCB is saved.

In the embodiment of FIG. 4, the magnetic core has a first magnetic core part 401 and a second magnetic core part 402 which are asymmetrical, wherein the first magnetic core part 401 is in a planar shape and the second magnetic core part 402 has two trenches, and wherein each of the passageways 403-1, 403-2 is respectively formed by a trench of the second magnetic core 402 and a surface 401-1 of the first magnetic core 401.

In the embodiment of FIG. 4, the metal layers 405-1 and 405-2 have a C shape. The metal layers 405-1 and 405-2 are configured to solder the top PCB 202 to the bottom PCB 201. The ends of the metal layers 405-1 and 405-2 for soldering the bottom PCB 201 are bent 90 degrees and extended to produce tabs to be soldered to the bottom PCB 201 with minimized PCB trace impedance inside the bottom PCB 201. Also, the ends of the metal layers 405-1 and 405-2 for soldering the top PCB 202 are bent 90 degrees and extended to produce tabs to be soldered to the ground reference pins of the power device chips 203 via the top PCB 202 with minimized PCB trace impedance inside the top PCB 202.

Figure 5:
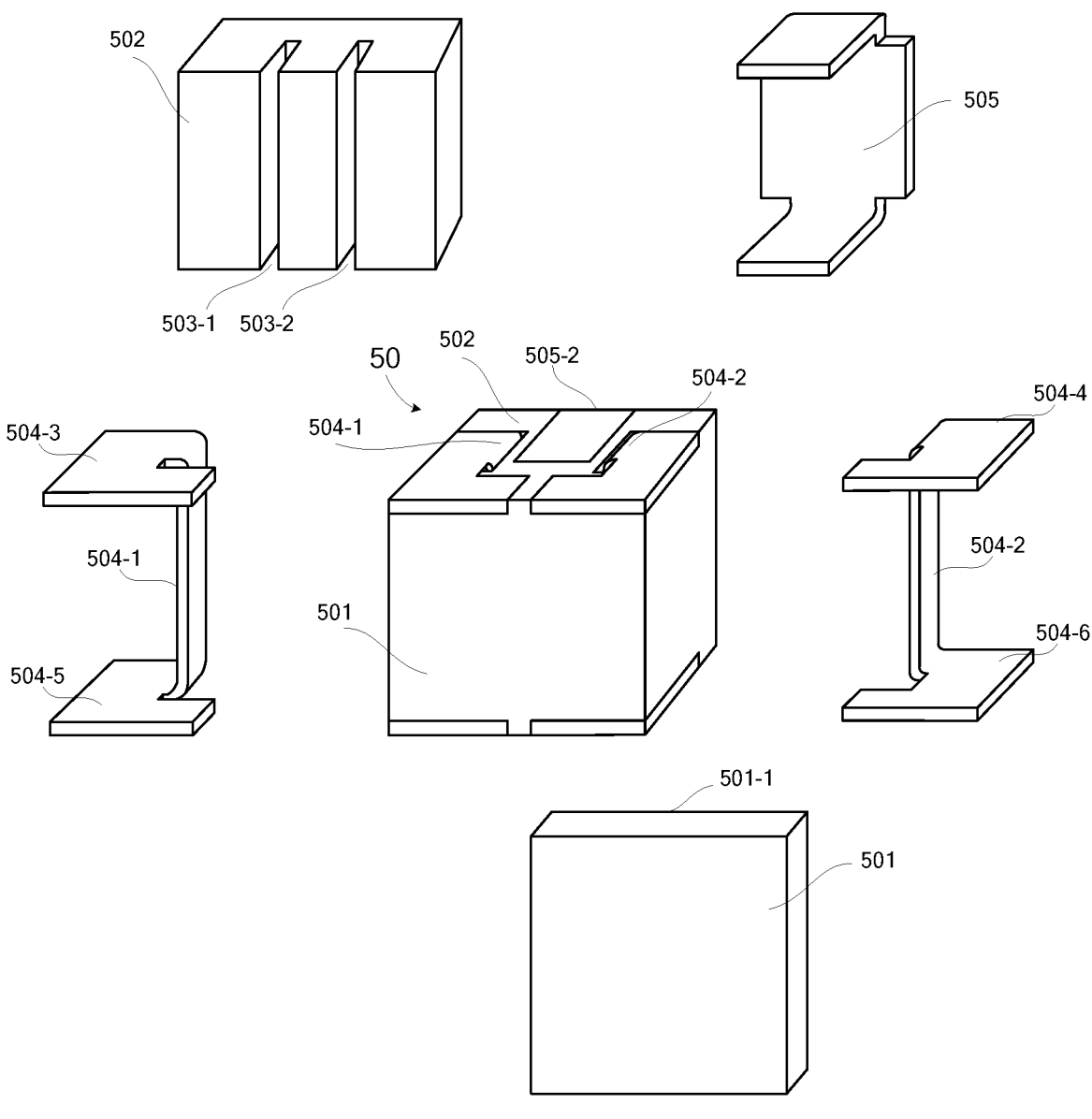
FIG. 5 shows the disassembled view of an inductor pack 50 in accordance with an embodiment of the present invention.

FIG. 5 shows the disassembled view of an inductor pack 50 in accordance with an embodiment of the present invention. The inductor pack 50 may be adopted as the inductor pack 206 in FIG. 2. As shown in FIG. 5, the inductor pack 50 comprises: a magnetic core having a first magnetic core part 501 and a second magnetic core part 502, wherein the first magnetic core part 501 and the second magnetic core part 502 are assembled to have two passageways 503-1 and 503-2 at a planer where the first magnetic core part 501 and the second magnetic core part 502 are aligned; and two windings 504-1 and 504-2 respectively passing through two passageways 503-1 and 503-2 between the first magnetic core part 501 and the second magnetic core part 502.

In the embodiment of FIG. 5, the passageways 503-1 and 503-2 have a depth along an axis B perpendicular to the bottom PCB 201 and the top PCB 202 if adopted by the power supply module 20 in FIG. 2.

In the embodiment of FIG. 5, the metal layer 505 has a C shape. The metal layer 505 is configured to solder the top PCB 202 to the bottom PCB 201. The end of the metal layer 505 for soldering the bottom PCB 201 are bent 90 degrees and extended to produce tabs to be soldered to the bottom PCB 201 with minimized PCB trace impedance inside the bottom PCB 201. Also, the end of the metal layer 505 for soldering the top PCB 202 are bent 90 degrees and extended to produce tabs to be soldered to the ground reference pins of the power device chips 203 via the top PCB 202 with minimized PCB trace impedance inside the top PCB 202. In the example of FIG. 5, the middle part of the metal layer 505 are extended to both sides to lower the impedance of the metal layer 505.

Compared with the inductor pack 40 in FIG. 4, the inductor pack 50 in FIG. 5 has one metal layer 505 for soldering the ground pins from the top PCB 202 to the bottom PCB 201. Since the area for another ground metal layer as in FIG. 4 is saved, the ends of the windings in the embodiment of FIG. 5 extend to larger areas at the top and the bottom of the inductor pack 50, which makes the power device chips 203 have more flexibility to configure pins.

The magnetic core having a first magnetic core part 501 and a second magnetic core part 502 in the embodiment of FIG. 5 is similar to the magnetic core in the embodiment of FIG. 4, and is not described here for brevity.

Figure 6:
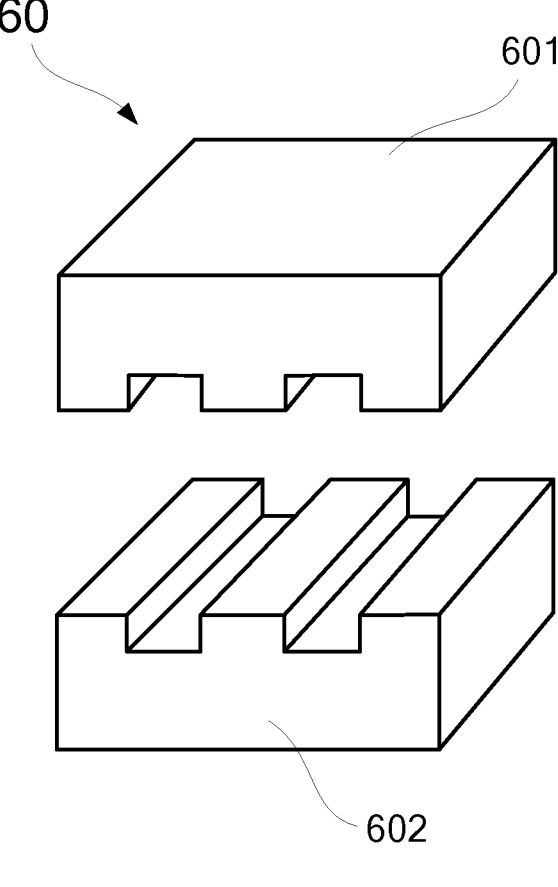
FIG. 6 shows a magnetic core 60 in accordance with an embodiment of the present invention.

FIG. 6 shows a magnetic core 60 in accordance with an embodiment of the present invention. In FIG. 6, the magnetic core 60 comprises a first magnetic core part 601 and a second magnetic core part 602 which are symmetrical, wherein each one of the magnetic core parts has two trenches. When the magnetic core 60 is adopted by the inductor pack 30 in FIG. 3, the inductor pack 40 in FIG. 4, or the inductor pack 50 in FIG. 5, each passageway for passing a winding is formed by a trench of the first magnetic core part 601 and a trench of the second magnetic core part 602.

Figure 7:
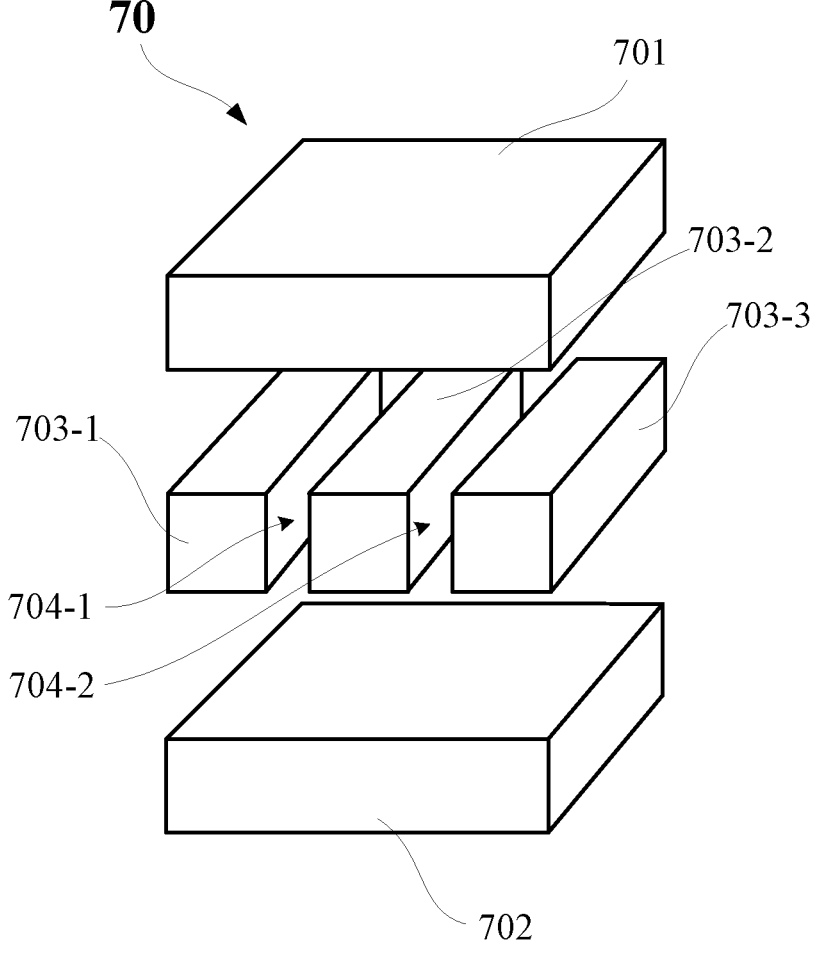
FIG. 7 shows a magnetic core 70 in accordance with an embodiment of the present invention.

FIG. 7 shows a magnetic core 70 in accordance with an embodiment of the present invention. In FIG. 7, the magnetic core 70 comprises a first magnetic core part 701, a second magnetic core part 702 and third magnetic core parts 703-1~703-3. The first magnetic core part 701, the second magnetic core part 702 and the third magnetic core parts 703-1 and 703-2 forms a passageway 704-1. The first magnetic core part 701, the second magnetic core part 702 and the third magnetic core parts 703-2 and 703-3 forms a passageway 704-2. More passageways could be formed when there are more third magnetic core parts. The first magnetic core part 701, the second magnetic core part 702 and the third magnetic core parts 703-1~703-3 could be made of different materials to provide a more flexible inductance-current curve.

In some embodiments of the present invention, the magnetic core parts of the magnetic core may be made of the same material, but have different geometries and/or percent composition to meet an inductance-current requirement of a target inductance profile, e.g., high inductance at low currents and low inductance at high currents. High inductance at low currents allows for higher efficiency, while low inductance at high currents allows for better transient response. In some embodiments, the magnetic core parts of the magnetic core may be made of different materials, like ferrite, iron powder, and any other suitable magnetic material to obtain a target inductance profile.

The inductor pack 30 in FIG. 3, the inductor pack 40 in FIG. 4 and the inductor pack 50 in FIG. 5 show magnetic cores with two windings respectively passing through two passageways of the magnetic cores for illustration. Persons of ordinary skill in the art should appreciate that the magnetic cores of the present invention could have any number of passageways and the corresponding windings according to the application requirement, like, one, or more than two.

In some embodiments, a gap may exist between the magnetic core parts of the magnetic core to form a coupled inductor. In some embodiments, independent inductors are formed with no gap between the magnetic core parts.

Figure 8:
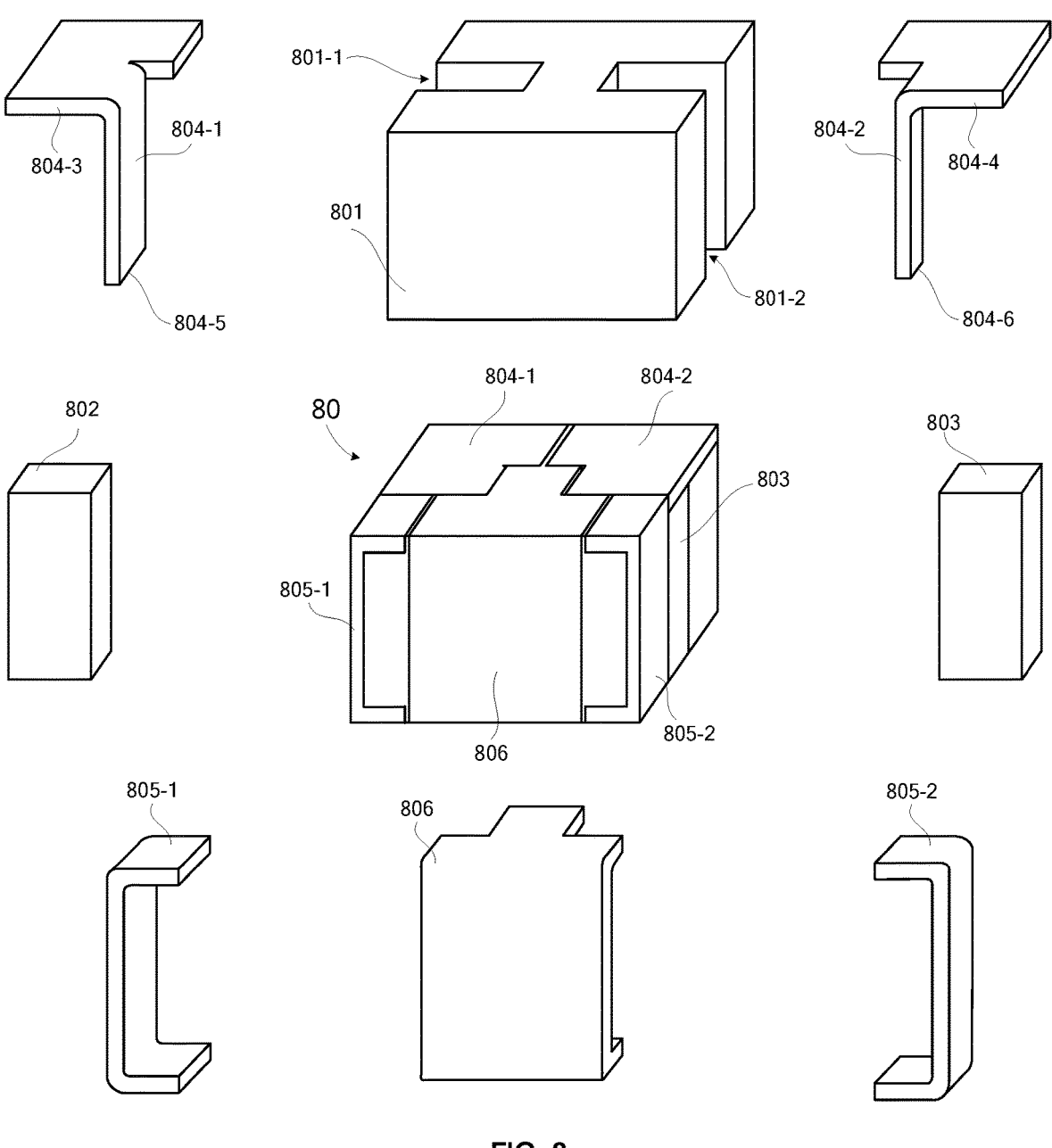
FIG. 8 shows the disassemble view of an inductor pack 80 in accordance with an embodiment of the present invention.

FIG. 8 shows the disassembled view of an inductor pack 80 in accordance with an embodiment of the present invention. The inductor pack 80 may serve as the inductor pack 206 in FIG. 2. As shown in FIG. 8, the inductor pack 80 comprises: a magnetic core having a first magnetic core part 801, a second magnetic core part 802 and a third magnetic core part 803, wherein the first magnetic core part 801, the second magnetic core part 802 and the third magnetic core part 803 are assembled to have two passageways 801-1 and 801-2 respectively at facing surfaces of the second magnetic core part 802 and the third magnetic core part 803 to the first magnetic core part 801; and two windings 804-1 and 804-2 respectively passing through two passageways 801-1 and 801-2.

In the embodiment of FIG. 8, the passageways 801-1 and 801-2 have a depth along an axis B perpendicular to the bottom PCB 201 and the top PCB 202 as shown in FIG. 2 if adopted by the power supply module 20.

In the embodiment of FIG. 8, the winding 804-1 has a first end 804-3 bent 90 degrees to cover part of a top surface of the magnetic core and extended along the top surface, and a second end 804-5 aligned to a bottom surface of the magnetic core. The first end 804-3 is extended at a plane perpendicular to an axis along the depth of the passageways 801-1 and 801-2 of the magnetic core, i.e., an axis along the depth of the winding 804-1, and the extension part of the first end 804-3 is soldered to the top PCB 202. The second end 804-5 is soldered to the bottom PCB 201 without extension part. Similarly, the winding 804-2 has a first end 804-4 bent 90 degrees to cover part of a top surface of the magnetic core and extended along the top surface, and a second end 804-6 aligned to a bottom surface of the magnetic core. The first end 804-4 is extended at a plane perpendicular to an axis along the depth of the passageways 801-1 and 801-2 of the magnetic core, i.e., an axis along the depth of the winding 804-2, and the extension part of the first end 804-4 is soldered to the top PCB 202. The second end 804-6 is soldered to the bottom PCB 201 without extension part.

In some embodiments, the second end 804-5 of the windings 804-1, and the second end 804-6 of the windings 804-2 are bent 90 degrees and extended like the first ends 804-3 and 804-4. Whether the second ends of the winding are bent or not, and the locations, shapes of the second ends of the windings, are determined by the locations of the associated solder pads on the bottom PCB of the power supply module, or the associated solder pads on a mainboard if the bottom PCB is saved.

In the embodiment of FIG. 8, the magnetic core comprises the first magnetic core part 801, the second magnetic core part 802 and the third magnetic core part 803. The first magnetic core part 801 has an "H" shape from top view, i.e., the first magnetic core part 801 has two trenches respectively at two opposite side surfaces. The second magnetic core part 802 and the third magnetic core part 803 have bar shape and fit into the trenches of the first magnetic core part 801 but leaves two passageways 801-1 and 801-2 along the trenches of the "H" shaped first magnetic core part 801. In some embodiments, the first magnetic core part 801 may have other symmetrical shapes from top view, with trenches distributed at two opposite side surfaces.

The first magnetic core part 801, the second magnetic core part 802 and the third magnetic core part 803 could be made of different materials to provide a flexible inductance-current curve. For example, the first magnetic core part 801 may be made of ferrite, and the second magnetic core part 802 and the third magnetic core part 803 may be made of sendust. It should be known that any prior art material may be used to make the magnetic core parts for obtaining a required inductance-current curve.

In the embodiment of FIG. 8, each one of metal layers 805-1, 805-2 and 806 has a C shape from side view. The metal layers 805-1, 805-2 and 806 are configured to solder the top PCB 202 to the bottom PCB 201. The ends of the metal layers 805-1, 805-2 and 806 for soldering the bottom PCB 201 and the top PCB 202 are bent 90 degrees and extended to produce tabs to be soldered to the bottom PCB 201 and the top PCB 202 with minimized PCB trace impedance inside PCBs. In one embodiment, the metal layers 805-1 and 805-2 are for soldering the ground reference pins of the power device chips 203 via the top PCB 202 to the bottom PCB 201 or to the mainboard directly with minimized PCB trace impedance. The metal layer 806 is for soldering the power pins (refer to the pins receiving the input voltage Vin in FIG. 1) of the power device chips 203 via the top PCB 202 to the bottom PCB 201 or to the mainboard directly with minimized PCB trace impedance.

Figure 9:
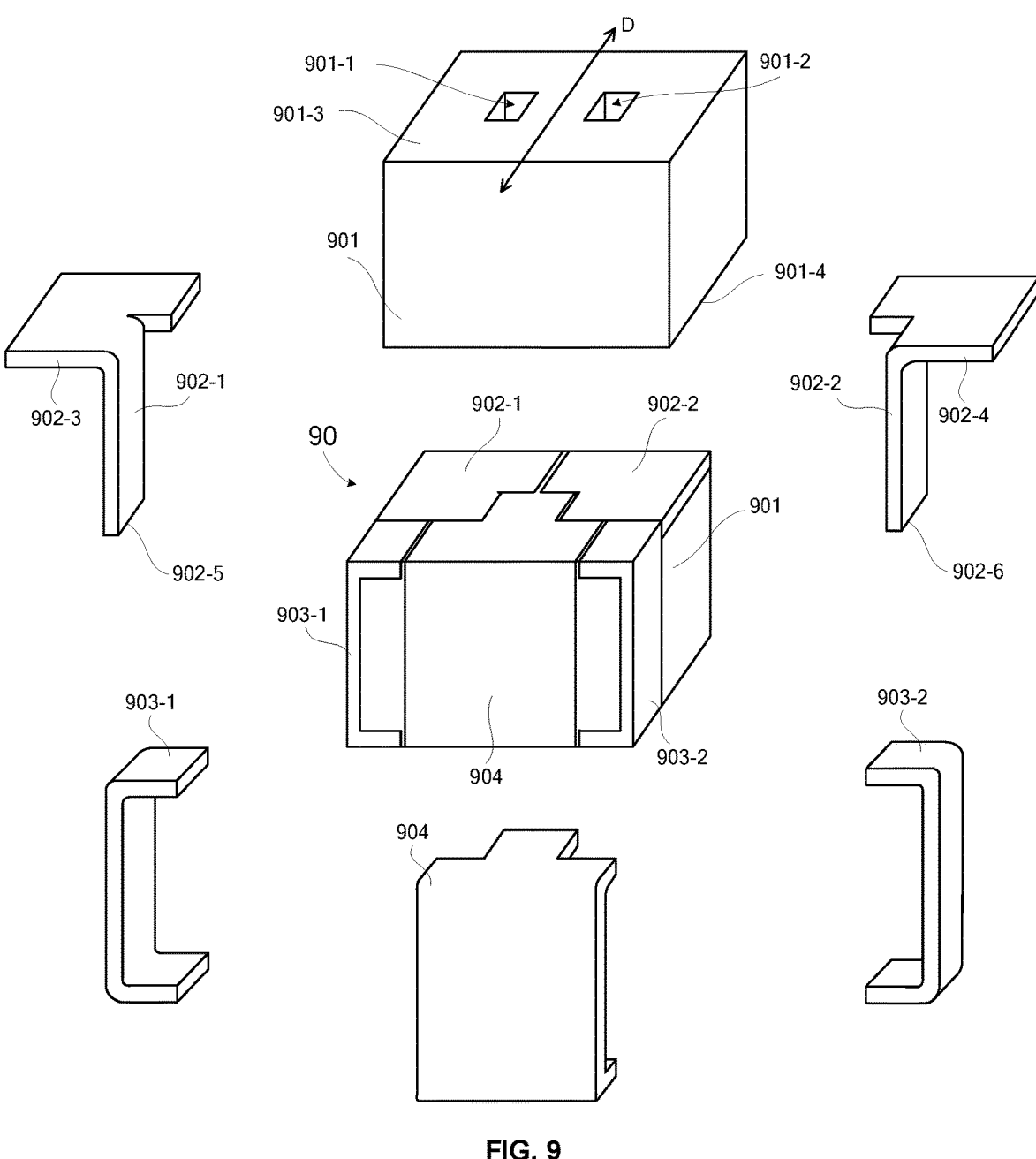
FIG. 9 shows the disassemble view of an inductor pack 90 in accordance with an embodiment of the present invention.

FIG. 9 shows the disassembled view of an inductor pack 90 in accordance with an embodiment of the present invention. The inductor pack 90 may serve as the inductor pack 206 in FIG. 2. As shown in FIG. 9, the inductor pack 90 comprises: a magnetic core 901 having a symmetrical shape from top view, and having two passageways 901-1 and 901-2 passing through the magnetic core 901 from top to bottom, and symmetrically located on two sides of a central axis "D" of a top surface of the symmetrical magnetic core 901; and two windings 902-1 and 902-2 respectively passing through the two passageways 901-1 and 901-2.

In the embodiment of FIG. 9, the passageways 901-1 and 902-2 have a depth along an axis B perpendicular to the bottom PCB 201 and the top PCB 202 as shown in FIG. 2 if adopted by the power supply module 20.

In the embodiment of FIG. 9, the winding 902-1 has a first end 902-3 bent 90 degrees to cover part of a top surface of the magnetic core 901 and extended along the top surface, and a second end 902-5 aligned to a bottom surface of the magnetic core. The first end 902-3 is extended at a plane perpendicular to an axis along the depth of the passageways 901-1 and 901-2 of the magnetic core 901, i.e., an axis along the depth of the winding 902-1, and the extension part of the first end 902-3 is soldered to the top PCB 202. The second end 902-5 is soldered to the bottom PCB 201 without extension part. Similarly, the winding 902-2 has a first end 902-4 bent 90 degrees to cover part of a top surface of the magnetic core 901 and extended along the top surface, and a second end 902-6 aligned to a bottom surface of the magnetic core. The first end 902-4 is extended at a plane perpendicular to an axis along the depth of the passageways 901-1 and 901-2 of the magnetic core 901, i.e., an axis along the depth of the winding 902-2, and the extension part of the first end 902-4 is soldered to the top PCB 202. The second end 902-6 is soldered to the bottom PCB 201 without extension part.

In some embodiments, the second end 902-5 of the windings 902-1, and the second end 902-6 of the windings 902-2 are bent and extended like the first ends 902-3 and 902-4. Whether the second ends of the winding are bent or not, and the locations, shapes of the second ends of the windings, are determined by the locations of the associated solder pads on the bottom PCB of the power supply module, or the associated solder pads on the mainboard if the bottom PCB is saved.

In the embodiment of FIG. 9, each one of metal layers 903-1, 903-2 and 904 has a C shape. The metal layers 903-1, 903-2 and 904 are configured to solder the top PCB 202 to the bottom PCB 201. The ends of the metal layers 903-1, 903-2 and 904 for soldering the bottom PCB 201 are bent 90 degrees and extended to produce tabs to be soldered to the bottom PCB 201 and the top PCB 202 with minimized PCB trace impedance inside the PCBs. In one embodiment, the metal layers 903-1 and 903-2 are for soldering the ground reference pins of the power device chips 203 via the top PCB 202 to the bottom PCB 201 or to the mainboard directly with minimized PCB trace impedance. The metal layer 904 is for soldering the power pins (refer to the pins receiving the input voltage Vin in FIG. 1) of the power device chips 203 via the top PCB 202 to the bottom PCB 201 or to a mainboard directly with minimized PCB trace impedance.

Figure 10:
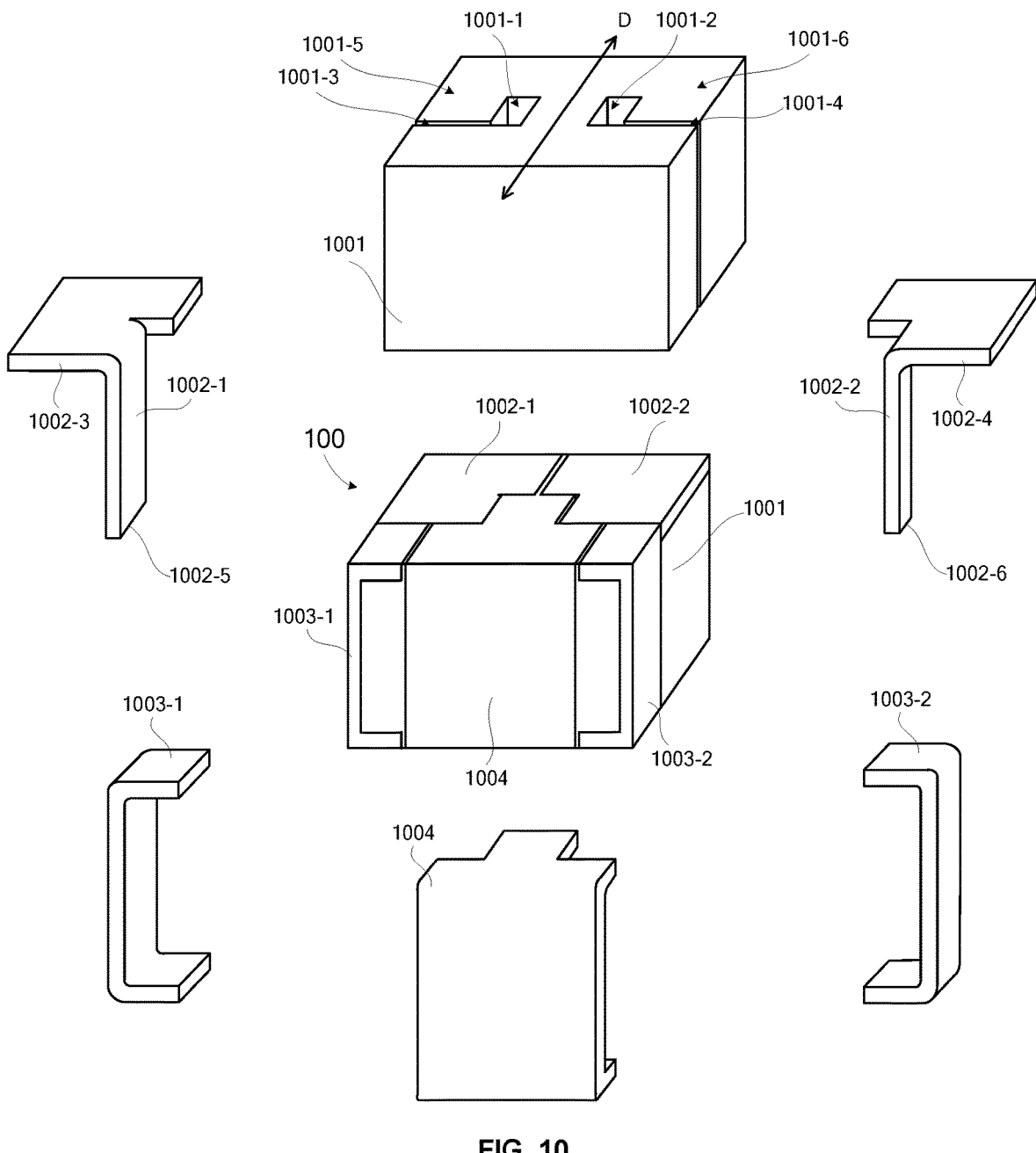
FIG. 10 shows the disassembled view of an inductor pack 100 in accordance with an embodiment of the present invention.

FIG. 10 shows the disassembled view of an inductor pack 100 in accordance with an embodiment of the present invention. The inductor pack 100 may serve as the inductor pack 206 in FIG. 2. As shown in FIG. 10, the inductor pack 100 comprises: a magnetic core 1001 having a symmetrical shape from top view, and having two passageways 1001-1 and 1001-2 passing through the magnetic core 1001 from top to bottom and symmetrically located on two sides of a central axis "D" of a top surface of the symmetrical magnetic core 1001, wherein two air gaps 1001-3, 1001-4 are respectively distributed along the passageways 1001-1 and 1001-2, passing through two arms 1001-5 and 1001-6 of the magnetic core 1001; and two windings 1002-1 and 1002-2 respectively passing through the two passageways 1001-1 and 1001-2.

The inductor pack 100 in FIG. 10 is similar with the inductor pack 90 in FIG. 9 and is not detailed herein for brevity. The difference is that the magnetic core 1001 in FIG. 10 has air gaps, thus has larger magnetic reluctance than the magnetic core 901.

In the embodiments of the present invention, the magnetic core or the magnetic core parts are assembled as a box. Persons of ordinary skill in art should know that the magnetic cores may have other shapes symmetrical from top view, like cylinder, hexagonal prism, etc.

In some embodiments, the inductor packs shown in FIGS. 8-10 may have metal layers having other shapes, e.g., L-shape, having a first end bent to be extended and soldered to the top PCB, like the metal layers 305-1 and 305-2 in FIG. 3. In some embodiments, the L-shaped metal layers may have a second end bent to be extended and soldered to the bottom PCB, or a mainboard if the bottom PCB is saved, i.e., the metal layers 305-1 and 305-2 in FIG. 3 is upside down.

In the present invention, to make the inductor packs have planar surfaces, the ends of the windings exposed outside the magnetic core and the metal layers that cover the surfaces of the magnetic cores are damascened into the magnetic core surfaces as shown in FIGS. 3-5 and 8-10.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A sandwich structure power supply module, comprising:

an inductor pack having a magnetic core, a first winding and a second winding;

a top PCB (Printed Circuit Board) on top of the inductor pack;

a first power device chip and a second power device chip on top of the top PCB, wherein the first power device chip has a power pin, a ground reference pin, and at least one pin electrically connected to the first winding via the top PCB, and the second power device chip has a power pin, a ground reference pin, and at least one pin electrically connected to the second winding via the top PCB;

a first metal layer electrically connected to the ground reference pin of the first power device chip, wherein the first metal layer covers a first side surface of the magnetic core, and wherein the first side surface is perpendicular to the top PCB;

a second metal layer electrically connected to the power pin of the first power device chip and the power pin of the second power device chip, wherein the second metal layer covers a second side surface of the magnetic core, and the second side surface is perpendicular to the first side surface and the top PCB; and a third metal layer electrically connected to the ground reference pin of the second power device chip, wherein the third metal layer covers a third side surface of the magnetic core, and the third side surface is parallel to the first side surface; wherein the first winding and the second winding each has a first end and a second end, and wherein at least one of the first end and the second end is bent to and extended at a plane perpendicular to an axis along a length of the winding.

2. The sandwich structure power supply module of claim 1, further comprising:

a bottom PCB at bottom of the sandwich structure power supply module; and a connector, connected between the bottom PCB and the top PCB, wherein the connector has a plurality of metal pillars respectively and electrically connecting solder pads on the bottom PCB to solder pads on the top PCB.

3. The sandwich structure power supply module of claim 1, wherein the magnetic core comprises first magnetic core part, a second magnetic core part and a third magnetic core part, wherein the first magnetic core part has trenches respectively at two opposite side surfaces, and the second magnetic core part and the third magnetic core part are fit into the trenches, and leave two passageways along the two trenches of the first magnetic core part; and wherein the two windings respectively pass through the two passageways between the first magnetic core part, the second magnetic core part and the third magnetic core part.

4. The sandwich structure power supply module of claim 1, wherein the magnetic core comprises a first magnetic core part, a second magnetic core part and a third magnetic core part, wherein the first magnetic core part has an "H" shape from top view, and has trenches respectively at two opposite side surfaces, and wherein the second magnetic core part and the third magnetic core part are fit into the trenches, and leave two passageways along the two trenches of the first magnetic core part; and wherein the two windings respectively pass through the two passageways between the first magnetic core part, the second magnetic core part and the third magnetic core part.

5. The sandwich structure power supply module of claim 1, wherein the magnetic core, having a symmetrical shape from top view, has two passageways passing through the magnetic core from top to bottom, and symmetrically located on two sides of a central axis of a top surface of the symmetrical magnetic core; and wherein the two windings respectively pass through the two passageways.

6. The sandwich structure power supply module of claim 1, wherein the magnetic core, having a symmetrical shape from top view, has two passageways passing through the magnetic core from top to bottom, and symmetrically located on two sides of a central axis of a top surface of the symmetrical magnetic core, wherein two air gaps are respectively distributed along the passageways, passing through two arms of the magnetic core; and wherein the two windings respectively pass through the two passageways.

7. The sandwich structure power supply module of claim 1, wherein at least one of the first metal layer, and the second metal layer has a C-shape from side view, and has a first end bent to be extended along and soldered to a bottom surface of the top PCB, and a second end bent to be extended along a bottom surface of the inductor pack.

8. The sandwich structure power supply module of claim 1, wherein at least one of the first metal layer, and the second metal layer has an L-shape and has a first end bent to be extended along and soldered to a bottom surface of the top PCB.

9. A power supply module, comprising:

an inductor pack having a magnetic core, a first winding and a second winding;

a top PCB (Printed Circuit Board) on top of the inductor pack;

a first power device chip and a second power device chip on top of the top PCB, wherein each of the first power device chip and the second power device chip has a first pin, a second pin and a third pin, the first pin of the first power device chip is electrically connected to the first winding via the top PCB, the first pin of the second power device chip is electrically connected to the second winding via the top PCB;

a first metal layer electrically connected to the second pin of the first power device chip, wherein the first metal layer at least partially covers a first side surface of the magnetic core, and wherein the first side surface is perpendicular to the top PCB;

a second metal layer electrically connected to the second pin of the second power device chip, wherein the second metal layer at least partially covers a second side surface of the magnetic core, and the second side surface is parallel to the first side surface; and a third metal layer electrically connected to the third pin of the first power device chip and the third pin of the second power device chip, wherein the third metal layer at least partially covers a third side surface of the magnetic core, and the third side surface is perpendicular to the first side surface and the top PCB; wherein each of the first winding and the second winding has a first end and a second end, and wherein at least one of the first end and the second end is bent to and extended at a plane perpendicular to an axis along a length of the winding.

10. The power supply module of claim 9, further comprising:

a bottom PCB at bottom of the power supply module; and a connector, connected between the bottom PCB and the top PCB, wherein the connector has a plurality of metal pillars respectively and electrically connecting solder pads on the bottom PCB to solder pads on the top PCB.

11. The power supply module of claim 9, wherein the magnetic core comprises a first magnetic core part, a second magnetic core part and a third magnetic core part, wherein the first magnetic core part has trenches respectively at two opposite side surfaces, and the second magnetic core part and the third magnetic core part are fit into the trenches, and leave two passageways along the two trenches of the first magnetic core part; and wherein the two windings respectively pass through the two passageways between the first magnetic core part, the second magnetic core part and the third magnetic core part.

12. The power supply module of claim 9, wherein the magnetic core comprises a first magnetic core part, a second magnetic core part and a third magnetic core part, wherein the first magnetic core part has an "H" shape from top view, and has trenches respectively at two opposite side surfaces, and wherein the second magnetic core part and the third magnetic core part are fit into the trenches, and leave two passageways along the two trenches of the first magnetic core part; and wherein the two windings respectively pass through the two passageways between the first magnetic core part, the second magnetic core part and the third magnetic core part.

13. The power supply module of claim 9, wherein the magnetic core, having a symmetrical shape from top view, has two passageways passing through the magnetic core from top to bottom, and symmetrically located on two sides of a central axis of a top surface of the symmetrical magnetic coFre; and wherein the two windings respectively pass through the two passageways.

14. The power supply module of claim 9, wherein the second pin is one of a ground reference pin and a power pin, and the third pin is the other one of the ground reference pin and the power pin.

15. The power supply module of claim 9, wherein at least one of the first metal layer, the second metal layer, and the third metal layer has a C-shape from side view, and has a first end bent to be extended along and soldered to a bottom surface of the top PCB, and a second end bent to be extended along a bottom surface of the inductor pack.

* * * * *